(12) United States Patent
Yu et al.

(10) Patent No.: US 10,620,054 B2
(45) Date of Patent: Apr. 14, 2020

(54) WAVEFRONT DETECTOR

(71) Applicant: Wisconsin Alumni Research Foundation, Madison, WI (US)

(72) Inventors: Zongfu Yu, Madison, WI (US); Soongyu Yi, Madison, WI (US); Dianjing Liu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 147 days.

(21) Appl. No.: 15/975,435

(22) Filed: May 9, 2018

(65) Prior Publication Data

US 2019/0346311 A1    Nov. 14, 2019

(51) Int. Cl.
*G01B 9/02* (2006.01)
*G01J 9/02* (2006.01)
*H01L 27/146* (2006.01)

(52) U.S. Cl.
CPC ...... *G01J 9/0215* (2013.01); *H01L 27/14643* (2013.01)

(58) Field of Classification Search
CPC .. G01J 9/0215; G01B 9/02098; H01L 27/146; H01L 27/14643; H01L 27/148; H01L 27/14806
See application file for complete search history.

(56) References Cited

U.S. PATENT DOCUMENTS

| 9,163,984 | B2* | 10/2015 | Nakamura | ............ G01J 3/0256 |
| 2013/0229486 | A1 | 9/2013 | Molnar et al. | |
| 2016/0218127 | A1* | 7/2016 | Kato | ................. H01L 27/14609 |
| 2018/0182798 | A1* | 6/2018 | Tack | ......................... G01J 3/26 |

OTHER PUBLICATIONS

Guoan Zheng "Angle-sensitive pixel design for wavefront sensing." arXiv preprint arXiv:1304.7339 (2013), California, US.

* cited by examiner

*Primary Examiner* — Tarifur R Chowdhury
*Assistant Examiner* — Jonathon Cook
(74) *Attorney, Agent, or Firm* — Boyle Fredrickson, S.C.

(57) ABSTRACT

A wavefront sensor system suitable for integration into an integrated circuit light detector may provide for wave angle sensors having varying functional relationships between the wave angle and signal to provide improved dynamic range. These wave angle sensors may be combined with integrated circuit phase angle sensors for a more complete analysis of the waveform.

8 Claims, 7 Drawing Sheets

WAVEFRONT DETECTOR

STATEMENT REGARDING FEDERALLY SPONSORED RESEARCH OR DEVELOPMENT

This invention was made with government support under DE-NA0002915 awarded by the U.S. Department of Energy. The government has certain rights in the invention.

CROSS REFERENCE TO RELATED APPLICATION

NA

BACKGROUND OF THE INVENTION

The present invention relates generally to imaging devices and in particular to wavefront angle or wavefront phase sensitive imaging devices.

Conventional digital cameras record light intensity from an illuminated scene, for example, using electronic sensors distributed over a focal plane, to each sense a "pixel" of the image to produce the image. By incorporating colored filters over the electronic sensors, light frequency as well as intensity may be recorded providing colored images.

Conventional digital cameras do not capture important information about the light received from an illuminated scene that may be expressed in the light's wavefront angle or phase. "Light field" or "plenoptic" cameras, however, can capture this wavefront information together with light intensity information providing a more complete representation of the illuminated scene. As a result, such cameras can change the focal distance and depth of field after the image is captured. More generally, the captured wavefront information provides a more complete record of the illuminated scene that may be useful in a variety of applications including postprocessing, image recognition, hologram generation, and the like.

The image sensors using conventional digital cameras, such as charge coupled devices (CCD), do not naturally detect wavefront information but can be modified to produce a Shack-Hartman type wavefront detector. Such modifications place an array of micro lenses in front of a standard image sensor, for example, each micro lens being associated with a two-dimensional zone of multiple pixels of the image sensor. Light received by each micro lens provides a focal spot whose position on the multiple pixels of the zone changes depending on the angle of the wavefront. By detecting which pixels detect the greatest light intensity (indicating the location of the focal spot) the wavefront angle may be deduced. The measured intensity of this focal spot is also used to provide the conventional image intensity information.

SUMMARY OF THE INVENTION

The present invention provides a wavefront detector employing "shadow casters" instead of micro lenses greatly simplifying the construction of a Shack-Hartman type wavefront detector, for example, directly on an integrated circuit substrate. Further, by providing shadow casters of different heights, the sensitivity of the wavefront detectors can be varied to effect an improved trade-off between wavefront angle sensitivity and range of wavefront angle detection.

In some embodiments, the shadow casters may be combined with integrated circuit light mixers generating constructive and destructive interference between light received at adjacent pixels to deduce absolute phase difference. This absolute phase difference can be used alone or combined with wave angle measurements for improved wavefront analysis.

A measurement of wavefront angle (for example, using a Shack-Hartman type wavefront detector) and a measurement of absolute phase difference (for example, using light mixing structures) will collectively be referred to as "wavefront detection" or as using a "wavefront sensor" herein.

Specifically, then, the present invention provides a wavefront sensor having an array of light intensity sensor elements tiling a substrate to receive light, the light having a wavefront angle with respect to a surface normal of the substrate. A set of shadow casters is provided where each shadow caster is associated with a group of at least two sensor elements to selectively shade different sensor elements of that group as a function of the wavefront angle. The different shadow casters have different heights above the substrate with respect to the surface normal to provide different shadow lengths along the substrate as a function of wavefront angle.

It is thus a feature of at least one embodiment of the invention to provide improved sensitivity in wavefront angle measurement while avoiding "clipping" or saturation that can cause the loss of information at high wavefront angles.

The wavefront sensor may include a circuit comparing light intensity measured by different sensor elements in a group to provide an output signal related to wavefront angle, and the circuit may apply a first or second predetermined function to light intensity measurements of the different sensors of the group depending on the height of the shadow caster associated with the group to provide the output signal.

It is thus a feature of at least one embodiment of the invention to accommodate arbitrarily complex changes in the functional relationship between brightness and wavefront angle for different shadow caster heights.

Each group of light sensing elements may be associated with a color filter, and the circuit may apply a different predetermined function to light intensity measurements of the different sensors of the group depending on the filter color.

It is thus a feature of at least one embodiment of the invention to correct for changes in the functional relationship between wavefront angle and sensor reading that occurs with different frequencies as noted by the inventors.

The group of sensor elements may be adjacent and separated over two dimensions along the substrate.

It is thus a feature of at least one embodiment of the invention to permit two dimensions of wavefront angle determination.

The shadow caster may be a perimeter wall surrounding a group of sensing elements.

It is thus a feature of at least one embodiment of the invention to provide a simple structure for fabrication using integrated circuit techniques.

The perimeter wall may partially cover the sensing elements.

It is thus a feature of at least one embodiment of the invention to permit ready adjustment of the sensitivity of the wavefront sensor by controlling the exposed area of the sensor elements where smaller exposed areas provide increased angular sensitivity.

The sensing elements may be displaced beneath a surface of the substrate.

It is thus a feature of at least one embodiment of the invention to provide a system that can work with common image sensing architectures in which the light sensors are positioned beneath a circuitry and connection layer.

The shadow casters of different heights are uniformly distributed over the surface of the substrate.

It is thus a feature of at least one embodiment of the invention to allow both high dynamic range and high sensitivity measurements throughout the image area.

The wavefront sensor may further include a set of mixers each associated with at least two sensor elements to receive light from adjacent separated locations along the plane of the substrate and to mix that light together before providing mixed light independently to each of the at least two sensor elements. The intensity of the light provided to the at least two sensor elements varies in intensity as a function of phase difference of light received by the mixer at the separated locations.

It is thus a feature of at least one embodiment of the invention to provide a wavefront sensor that can reveal absolute phase differences between sensing locations.

Each mixer may provide a first and second inlet light pipe leading from respective adjacent separated locations and communicating with a common cavity and may further provide a first and second outlet light pipe leading from the cavity to two different sensor elements.

It is thus a feature of at least one embodiment of the invention to provide a structure that can be simply integrated into an integrated circuit image sensor.

The mixer may be a transparent semiconductor material of the substrate embedded with in a substrate material a different index of refraction.

It is thus a feature of at least one embodiment of the invention to provide a wavefront sensor using readily available integrated circuit materials.

Different ones of the set of mixers maybe associated with pairs of adjacent separated locations displaced along different dimensions of the plane of the substrate.

It is thus a feature of at least one embodiment of the invention to provide phase difference measurements in two orthogonal directions to provide a better reconstruction of two-dimensional wavefronts.

The circuit may further compare light intensity measured by the at least two sensor elements associated with a mixer to provide an output equal to a phase difference between light received at the adjacent separated locations.

It is thus a feature of at least one embodiment of the invention to provide a decoding of phase information to be added to other information from the image sensor.

The circuit may combine the phase differences from the mixer with the wavefront angle to provide a description of a wavefront received at the substrate.

It is thus a feature of at least one embodiment of the invention to provide a more complete description of the wavefront by combining wavefront angle and absolute phase differences.

Some sensor elements of the substrate are associated with shadow casters and do not have mixers and some sensors of the substrate have mixers and are not associated with shadow casters.

It is thus a feature of at least one embodiment of the invention to provide wavefront angle and wavefront phase measurements in the single sensor system.

These particular objects and advantages may apply to only some embodiments falling within the claims and thus do not define the scope of the invention.

DETAILED DESCRIPTION OF THE PREFERRED EMBODIMENT

Figure 1:
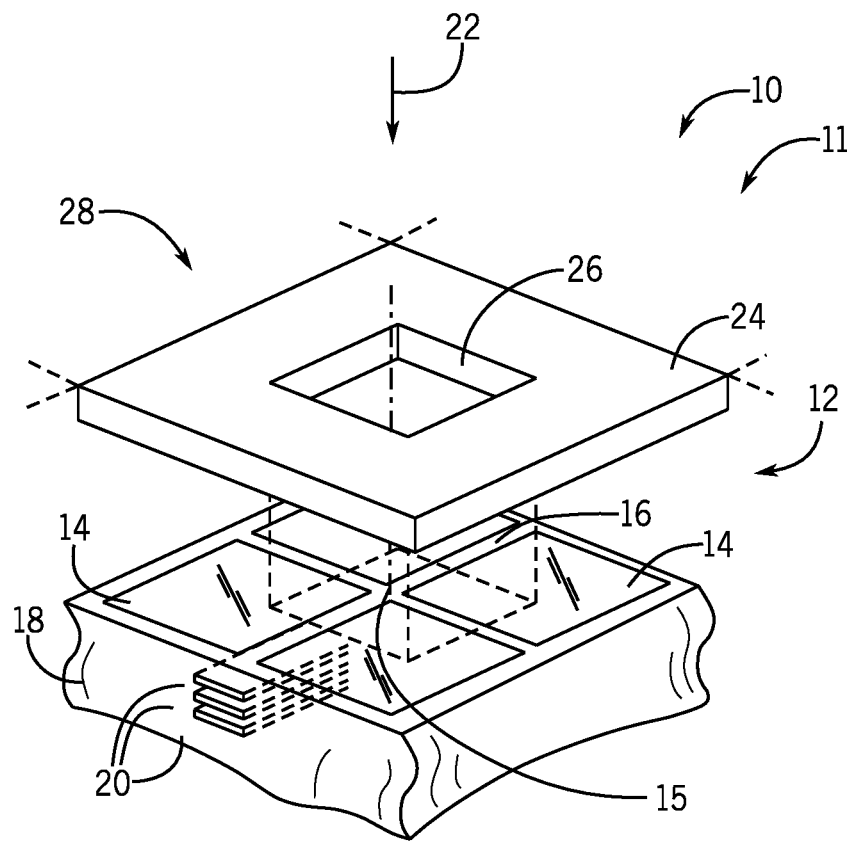
FIG. 1 is a fragmentary, exploded perspective view of a portion of an image sensor showing individual sensor elements in regular rows and columns positioned behind a shadow casting mask for identification of wavefront angle.

Referring now to FIG. 1, a wavefront detector 10 of the present invention may provide a wavefront angle sensor 11 working in conjunction with a standard integrated circuit image sensor 12 having an array of light sensing elements (pixels 14) arranged in rows and columns separated by gutters 16 on an integrated circuit substrate 18. Generally, the light sensing elements may be photodiodes either positioned adjacent to an upper planar surface of the substrate 18 or on a lower layer of the substrate 18 (as depicted) with light passing through upper layers of the substrate 18 to reach the photodiodes. In this latter case, processing circuitry and intercommunicating conductors 20 may be placed between the pixels 14, for example, in the gutters 16. In either case, the pixels 14 are sensitive to light passing along (not necessarily parallel to) an axis 22 aligned with a surface normal of the substrate 18 and provide independent electrical signals indicating light received within the area of the pixel 14.

Figure 2:
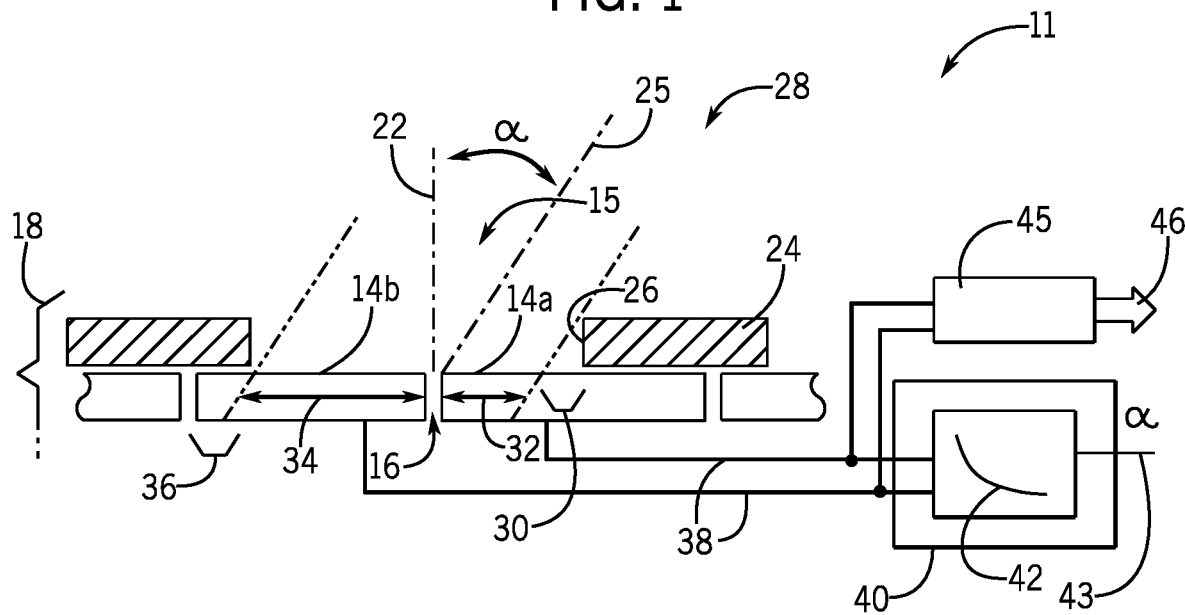
FIG. 2 is a cross-section along line 2-2 of FIG. 1 showing the effect of the shadow generated by the shadow casting mask in changing exposed areas of the sensor elements as may be measured to deduce wavefront angle.

Referring also to FIG. 2, a shadow-casting mask 24 may be placed over the pixels 14 to block some but not all incoming light along axis 22. Generally, the mask 24 includes an opening 26 exposing portions of four adjacent pixels 14 positioned around a shared centerpoint 15 in the center of the mask 24. The mask 24 exposes a detection zone 28 of the adjacent pixels 14.

In this embodiment, the mask 24 provides a square frame that covers portions of each of the pixels 14 along an outer periphery of that detection zone 28. The mask 24, for example, may be a metallization layer and may have many different openings 26 defining corresponding multiple zones 28 over the entire area of the image sensor 12 having many pixels 14.

Figure 3:
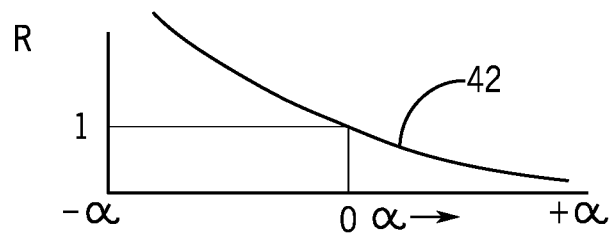
FIG. 3 is a plot of a ratio of the intensity of the light in the pixel elements of FIG. 2 as a function of angle in a simplified two-dimensional example such as may be used by circuitry to create an angle measurement from this ratio information.

Referring now to FIG. 3, light passing along a light axis 25 at an angle $\alpha$ with respect to axis 22 and through centerpoint 15 will generate a shadow 30 over at least one pixel 14a caused by an inner wall of the opening 26, the latter extending along axis 22. The particular pixel 14a being shadowed will be pixel 14 whose surface forms an acute angle with respect to the light axis 25.

The shadow 30 on the pixel 14a and the mask 44 decreases a total area of illumination of this pixel 14a to a reduced area 32.

Conversely pixel 14b who surface forms an obtuse angle with respect to light axis 25 does not have a shadow 30 and provides a larger exposure area 34 equal to the full area of the exposed portion of the pixel 14b through the mask 24 as well as a leakage area 36 of light passing underneath the mask 24 into the pixel 14b. In addition, some portion of light entering the surface of pixel 14a near axis 22 with incident angle $\alpha$ can travel long enough to reach the pixel 14b.

Electrical signals 38 from the pixels 14a and 14b may be received by comparison circuitry 40 to deduce the wavefront angle 43 (angle $\alpha$) by applying a ratio formed from the light intensity measured by pixels 14a and 14b to an empirically described transform curve 42. While in this simple example only a single dimension of pixels 14a and 14b is shown, this angle can be readily extended to two perpendicular directions by considering the ratio of the intensity of light in each of the four pixels 14 of the zone 28. So, for example, a ratio between the two columns of pixels 14 may determine light angle in one direction, and a ratio between the two rows of pixels 14 may determine a light angle in the perpendicular direction.

Referring now to FIG. 3, this transform curve will generally show a ratio moving between a value of one for angles of $\alpha$ equal 0 and to higher or lower angles as a ratio deviates above and below 1. This transformation between a ratio value and an angle $\alpha$ may be accomplished through discrete circuitry or through a microprocessor executing a simple program accessing a lookup table or performing the calculation based on an established formula. These same electrical signals 38 may be received by conventional image processing circuitry 45 for the generation of an intensity image 46 as is understood in the art.

Figure 4:
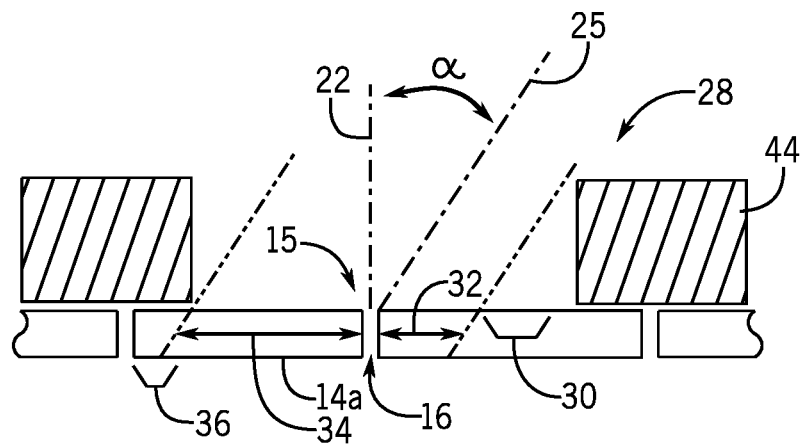
FIG. 4 is a figure similar to FIG. 2 showing a shadow caster having a higher elevation from the sensor substrate such as produces greater sensitivity to wavefront angle.
Figure 5:
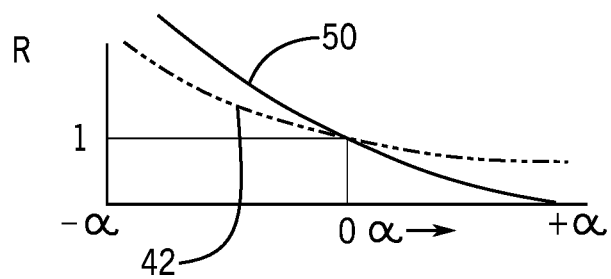
FIG. 5 is a figure similar to that of FIG. 3 showing a plot of the ratio of the intensity of light in the pixel elements of FIG. 4 as a function of angle as compared to the same plot of FIG. 3 showing the change in sensitivity commensurate with the reduction in measurement range.

Referring now to FIG. 4, some zones 28 may employ a thicker mask 44 having a larger height measured along axis 22 than the height of mask 24 shown in FIG. 2. This taller mask 44 will provide larger shadows 30 for a given angle $\alpha$; however, it will generally not change the leakage areas 36. Nevertheless, the proportionally greater shadow 30 will produce a greater sensitivity to values of a as shown by transform curve 50 compared to transform curve 42. On the other hand, this greater sensitivity means that the transform curve 50 can operate in a narrower range of angle $\alpha$ since the angle $\alpha$ where the shadow 30 will cover the whole pixel 14a is smaller when mask 44 is used instead of mask 24.

Figure 6:
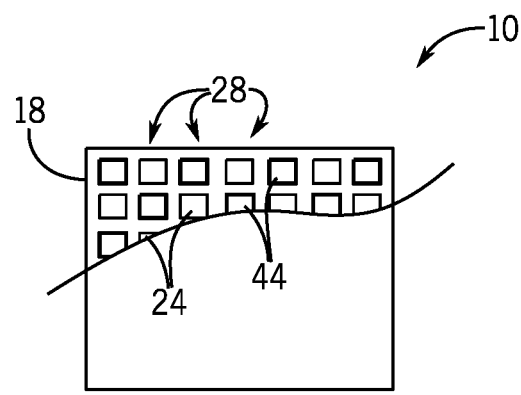
FIG. 6 is a fragmentary top plan view of an image sensor incorporating the shadow casters of FIGS. 2 and 4 to provide both high sensitivity and high range type sensors.

Referring to FIG. 6, the present invention contemplates that at least two thicknesses of masks 24 and 44 may be used on different zones 28 of wavefront detector 10 to provide a trade-off between high sensitivity and high dynamic range. For example, masks 24 and 44 may be alternated along given rows and columns of the zones 28. Each of these zones 28 will be associated with circuitry using either transform curve 42 or 50 as is appropriate for the height of the mask 24 or 44 associated with that zone 28. The invention further contemplates that masks of multiple different thicknesses (not just two) may be used if desired, again, with corresponding transform curves.

Figure 7:
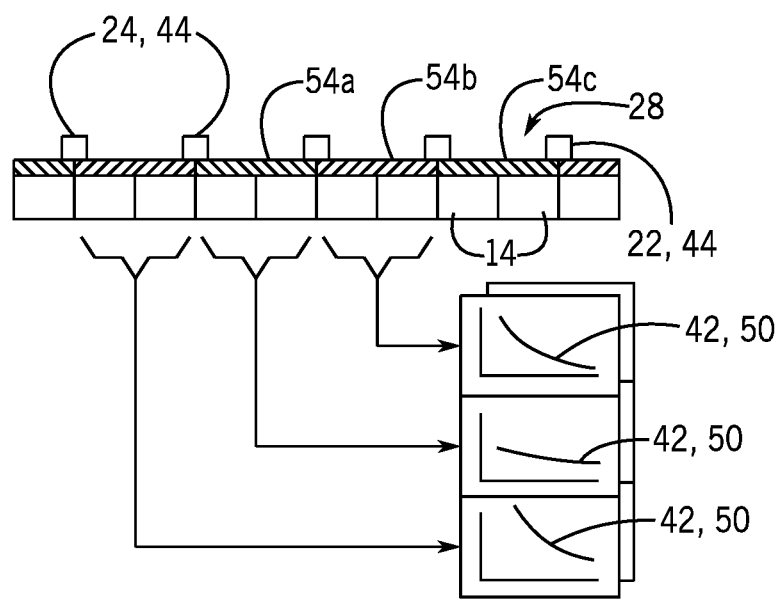
FIG. 7 is a cross-sectional view similar to FIGS. 3 and 4 showing interposition of colored filters, for example, used for color imaging, to produce signals applied to different functions converting the intensity ratios into wavefront angles for the different colors.

Referring now to FIG. 7, a color camera may be implemented by associating colored filters 54a-54c (typically red, green, and blue) with each zone 28 of pixels 14. The inventors have determined that such filtration can modify curves 42 and 50 and, accordingly, a set of different curves (three associated with masks 24 and three associated with masks 44, one mask for each color) may be used by the circuitry 40 in deducing angle $\alpha$. A combined signal from the pixels 14 of each zone 28, according to their particular filter 54, may also be sent to the image processor 45 for the development of a standard color image. The circuitry 40 completes the wavefront angle sensor 11.

Figure 8A:
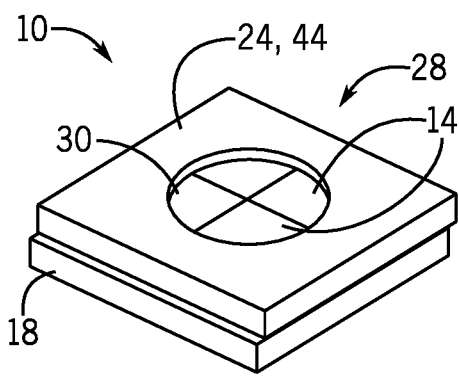
FIG. 8a-c are fragmentary perspective views similar to that of FIG. 1 but unexploded showing alternative shadow casters including a circular mask in FIG. 8a, a post structure in FIG. 8b, and a partial wall structure in FIG. 8c.
Figure 8B:
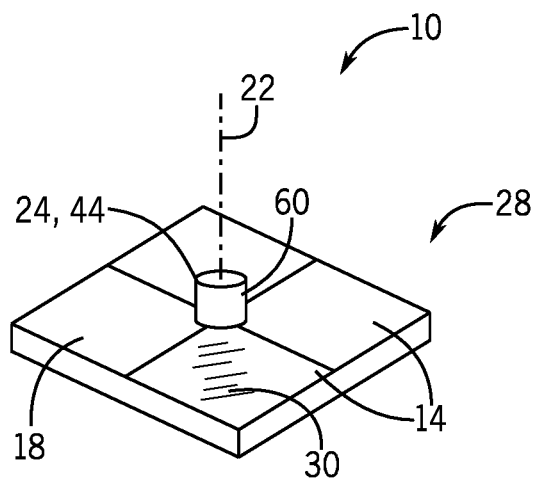
Figure 8C:
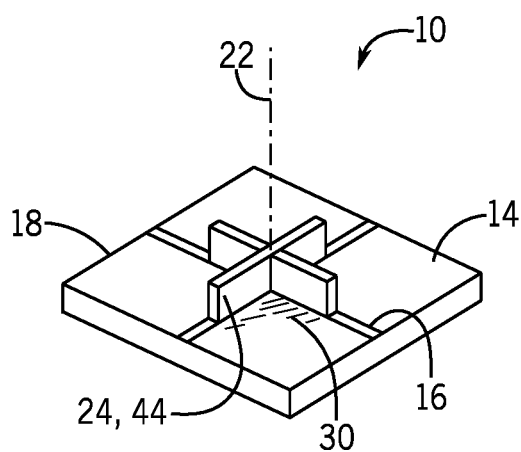

Referring now to FIG. 8a, it will be appreciated that the mask 24 or 44 may have a circular opening rather than the square opening of opening 26 shown in FIG. 1 to provide improved symmetry but at the cost of reduced exposed pixel area. In some embodiments, the mask 24 and 44 may be placed totally over the gutter area to reduce blockage of the pixels 14. As shown in FIG. 8b, other shadow casting structures may be readily used including a post 60 or other gnomon structure extending upward along axis 22, for example, centered within the zone 28 of four pixels with a shadow 30 falling on one or more of the pixels 14 depending on the angle of the light axis 25 of the incoming light. As shown in FIG. 8c, the post may be compressed to a cruciform lying completely within the gutter 16 of the light sensor. As before, the height of the structures may be adjusted to effect a trade-off between sensitivity and dynamic range as discussed above.

Figure 9:
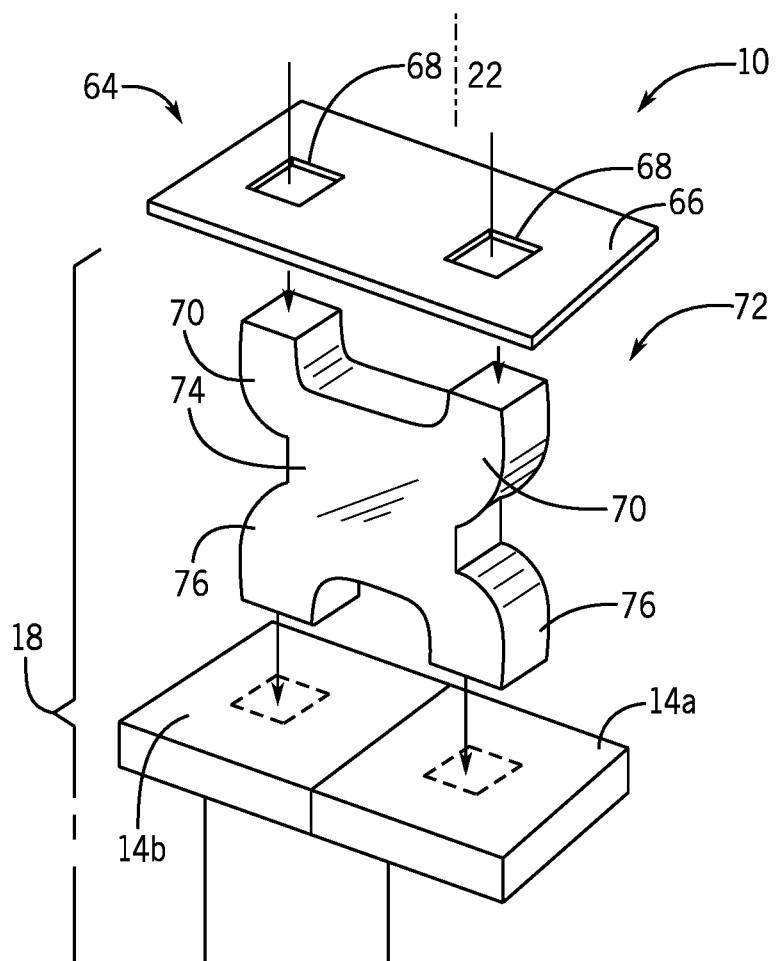
FIG. 9 is a figure similar to FIG. 1 showing an alternative wavefront sensor design providing absolute phase difference measurements between adjacent pixels using an integrated circuit-mounted light mixing element.

Referring now to FIG. 9, a phase difference sensor 64 may be constructed indicating an absolute phase difference between the adjacent locations of light reception on the wavefront detector 10. The phase difference sensor 64 provides phase information rather than waveform angle provided by the wavefront angle sensor 11 discussed above. The difference between these types of sensors will be discussed in more detail below with respect to FIG. 11.

In this embodiment, a mask structure 66 (for example, a metallization layer) may be positioned over the pixels 14 providing a sample aperture 68, for example, centered over each pixel 14 and otherwise blocking light transmission to the pixel 14. Light from the adjacent apertures 68 (which will be displaced laterally from each other) may be received by corresponding light pipes 70 of a mixer 72 formed in the integrated circuit material of the substrate 18 beneath the mask structure 66. For example, the light pipes 70 may be constructed from transparent silicone dioxide surrounded by a material of higher index of refraction to provide a reflective interface.

The light pipes 70 may join to a light cavity 74 of similar material so that the light from each of the light pipes 70 mixes together to constructively and destructively interfere. After this mixing, the light is then conducted out of exit light pipes 76 (of similar material to the light cavity 74) carrying this light to respective pixels 14a and 14b, for example, being adjacent along a given axis of the array and beneath the corresponding aperture 68.

The cavity 74 may be designed as an interferometer in the manner of the combining portion of a Mach-Zehnder interferometer. More generally, the light exiting from the different light pipes 76 will have different intensities based on different interference paths in the light cavity 74 from the light received by the two entrance light pipes 70. For example, a rightmost light pipe 76 may sum together some light frequencies received by the light pipe 70 whereas the leftmost light pipe 76 may subtract those frequencies. More generally, the output from the light pipes 76 will be different complex summations of the light from the two entrance light pipes 70 with varying frequency offsets.

The intensity of light measured by the pixels 14a and 14b may be compared (for example, using a ratio) and this comparison applied to an empirically derived transform curve 80 to produce a phase difference signal 82 indicating the phase difference between the lights arriving at the aperture 68. This light may be pre-filtered by colored filters as discussed above. More generally a phase difference signal 82 may be generated by a multidimensional function directly receiving intensity signals 38 from the pixels 14.

Figure 10:
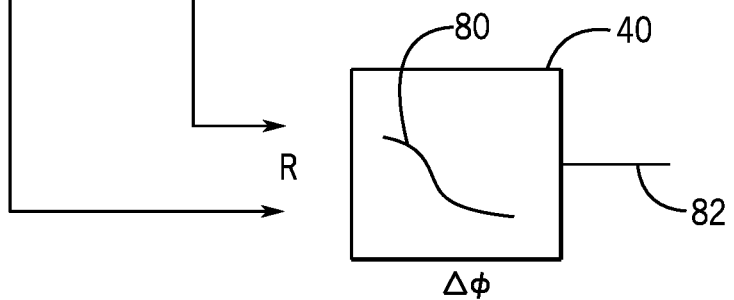
FIG. 10 is a figure similar to FIG. 6 showing interconnection of the mixers at various image points to provide two-dimensional phase difference measurements.
Figure 10:
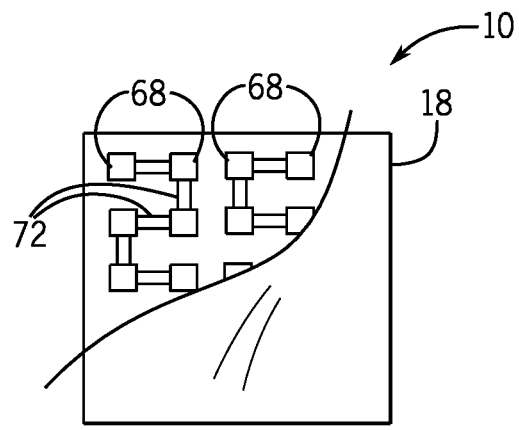

Referring momentarily to FIG. 10, the sample apertures 68 may extend regularly in two dimensions over the surface of the substrate 18 and may be pairwise connected by mixers 72 along two perpendicular directions of the substrate 18, for example, in a serpentine path as depicted, to provide phase difference measurements into orthogonal directions. In this regard each aperture 68 may feed two different mixers 72.

Figure 11A:
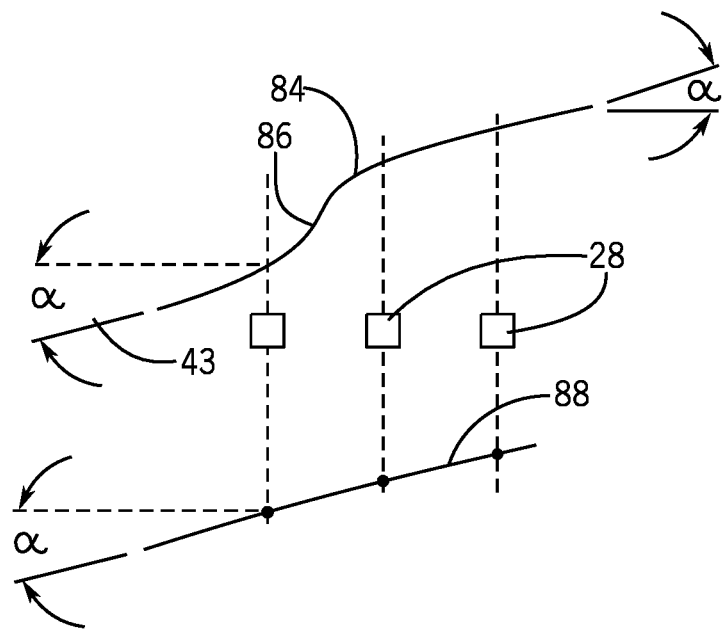
FIGS. 11a and 11b are example waveforms received by the sensor systems of FIGS. 1 and 9 respectively showing interpretation of that data.
Figure 11B:
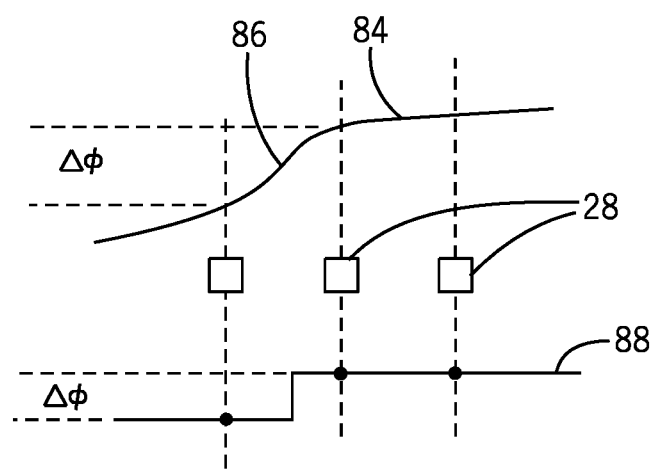

Referring now to FIGS. 11a and 11b, the difference between measurement of a wavefront angle 43 (per the wavefront angle sensor 11 shown in FIG. 2) and a phase difference measurement (per the phase difference sensor 64 shown in FIG. 9) can be understood by reviewing an example waveform 84 having a step phase shift 86. A set of spaced measurement zones 28 that can detect only wavefront angle α, for example, per the sensors shown in FIGS. 1-8 and will provide identical measurements of wavefront angle 43 at each zone 28 based on the incident of wavefront angles at the zones 28 resulting in a reconstructed waveform 88 blind to the step phase shift 86, as shown in FIG. 11a.

In contrast, as shown in FIG. 11b, a sensor of the type shown in FIG. 9 measuring a change in phase angle will accurately reflect the step phase shift 86 in a reconstructed waveform 88 made from measurements at zones 28, albeit without capturing the wavefront angle 43. By combining these two types of data, an improved waveform can be developed approximating waveform 84 by enforcing the necessary angles on the wavefront at the angle measurement points and the necessary phase differences at the phase difference points.

Figure 12:
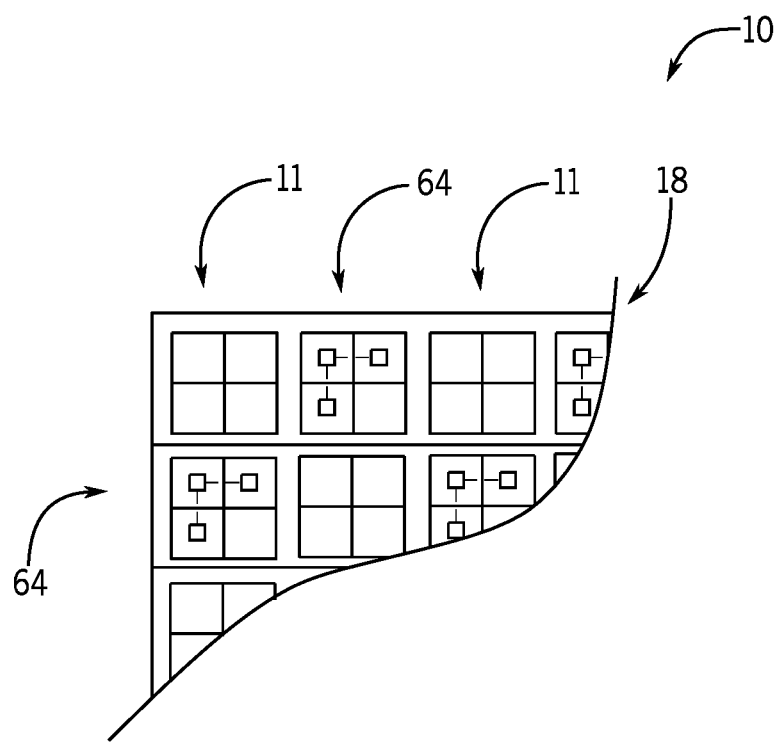
FIG. 12 is a top plan view of an integrated circuit substrate for light sensing similar to FIGS. 6 and 10 showing a hybrid sensor element incorporating both wavefront angle and wavefront phase sensing.

Referring now to FIG. 12, the benefit of both of these different types of measurements of wavefront angle and absolute phase difference may be provided by alternating or otherwise distributing wavefront angle sensors 11 and phase difference sensors 64 over the surface of the substrate 18 to blend these types of measurements to create a more accurate rendition of the incoming waveform. It will be appreciated that light collected by the wavefront angle sensor 11 and phase difference sensors 64 may also be used in the construction of the standard image, for example, by tapping into the signals as shown in FIG. 2. In addition, the wavefront angle sensors 11 may include both sensor masks 24 and 44 to provide improved dynamic range.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A wavefront sensor comprising:
    an array of light intensity sensing elements tiling a substrate to receive light having a wavefront angle with respect to a surface normal of the substrate;
    a set of shadow casters, each shadow caster associated with a group of at least two sensing elements to selectively shade different sensing elements of that group as a function of the wavefront angle;
    wherein different shadow casters have different heights above the substrate with respect to the surface normal to provide different shadow lengths along the substrate as a function of wavefront angle; and
    a circuit comparing light intensity measured by different sensing elements in a group to provide an output signal related to wavefront angle.

2. The wavefront sensor of claim 1 wherein the circuit applies at least a first and second predetermined function to light intensity measurements of the different sensors of the group depending on the height of the shadow caster associated with the group to provide the output signal.

3. The wavefront sensor of claim 2 wherein the group of light sensing elements is associated with a color filter and wherein the circuit applies a different predetermined function to light intensity measurements of the different sensors of the group depending on a color of the filter.

4. The wavefront sensor of claim 1 wherein the group of sensing elements are adjacent and are separated over two dimensions along the substrate.

5. The wavefront sensor of claim 1 wherein the shadow caster is a perimeter wall surrounding a group of sensing elements.

6. The wavefront sensor of claim 5 wherein the perimeter wall partially covers the sensing elements.

7. The wavefront sensor of claim 1 wherein the sensing elements are displaced beneath a surface of the substrate.

8. The wavefront sensor of claim 1 wherein shadow casters of different heights are uniformly distributed over the surface of the substrate.

* * * * *